United States Patent
Chen et al.

(10) Patent No.: US 9,502,305 B2
(45) Date of Patent: Nov. 22, 2016

(54) METHOD FOR MANUFACTURING CMOS TRANSISTOR

(71) Applicant: UNITED MICROELECTRONICS CORP., Hsin-Chu (TW)

(72) Inventors: Yi-Wei Chen, Tai-Chung Hsien (TW); Teng-Chun Tsai, Tainan (TW); Chien-Chung Huang, Taichung (TW); Jei-Ming Chen, New Taipei (TW); Tsai-Fu Hsiao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 289 days.

(21) Appl. No.: 14/060,568

(22) Filed: Oct. 22, 2013

(65) Prior Publication Data

US 2014/0038374 A1    Feb. 6, 2014

Related U.S. Application Data

(62) Division of application No. 12/168,062, filed on Jul. 3, 2008, now abandoned.

(51) Int. Cl.
*H01L 21/8238* (2006.01)
*H01L 21/265* (2006.01)
*H01L 29/165* (2006.01)
*H01L 29/66* (2006.01)
*H01L 29/78* (2006.01)

(52) U.S. Cl.
CPC . *H01L 21/823814* (2013.01); *H01L 21/26506* (2013.01); *H01L 21/823807* (2013.01); *H01L 29/165* (2013.01); *H01L 29/66628* (2013.01); *H01L 29/7843* (2013.01)

(58) Field of Classification Search
CPC .............. H01L 21/26506; H01L 21/823807; H01L 21/823814; H01L 29/165; H01L 29/66628; H01L 29/7843
USPC ............................................... 438/232
See application file for complete search history.

(56) References Cited

U.S. PATENT DOCUMENTS 6,187,655 B1    2/2001  Wang
6,274,447 B1    8/2001  Takasou
(Continued)

FOREIGN PATENT DOCUMENTS

TW    200518350    6/2005
TW    200525759    8/2005
TW    I253716      4/2006

OTHER PUBLICATIONS

Chen Yi-Wei et al., "Method to reduce P+ SiGe epi and N+ non-SiGe silicide Rs variation", Invention disclosure, May 8, 2007, p. 1-12.

*Primary Examiner* — Vongsavanh Sengdara
(74) *Attorney, Agent, or Firm* — Winston Hsu; Scott Margo

(57) ABSTRACT

A CMOS transistor and a method for manufacturing the same are disclosed. A semiconductor substrate having at least a PMOS transistor and an NMOS transistor is provided. The source/drain of the PMOS transistor comprises SiGe epitaxial layer. A carbon implantation process is performed to form a carbon-doped layer in the top portion of the source/drain of the PMOS transistor. A silicide layer is formed on the source/drain. A CESL is formed on the PMOS transistor and the NMOS transistor. The formation of the carbon-doped layer is capable of preventing Ge out-diffusion.

9 Claims, 6 Drawing Sheets

(56) References Cited

U.S. PATENT DOCUMENTS

| | | | |
|---|---|---|---|
| 6,509,264 B1* | 1/2003 | Li | H01L 21/28518 257/E21.165 |
| 6,777,275 B1 | 8/2004 | Kluth | |
| 6,849,527 B1* | 2/2005 | Xiang | H01L 21/26506 257/E21.335 |
| 6,869,867 B2 | 3/2005 | Miyashita | |
| 7,384,853 B2 | 6/2008 | Chen | |
| 7,402,872 B2 | 7/2008 | Murthy | |
| 7,655,984 B2 | 2/2010 | Chen | |
| 7,696,578 B2* | 4/2010 | Chen | H01L 21/823807 257/369 |
| 2001/0045605 A1 | 11/2001 | Miyashita | |
| 2005/0079692 A1 | 4/2005 | Samoilov | |
| 2006/0160290 A1 | 7/2006 | Chong | |
| 2006/0281288 A1 | 12/2006 | Kawamura | |
| 2007/0048907 A1* | 3/2007 | Lee | H01L 21/3147 438/142 |
| 2007/0049014 A1 | 3/2007 | Chen | |
| 2007/0166936 A1 | 7/2007 | Tsao | |
| 2008/0124858 A1* | 5/2008 | Nguyen | H01L 21/84 438/217 |
| 2008/0128806 A1 | 6/2008 | Liu | |
| 2008/0199999 A1* | 8/2008 | Weijtmans | H01L 29/165 438/285 |
| 2008/0242032 A1* | 10/2008 | Chakravarthi | H01L 21/26513 438/285 |
| 2008/0283926 A1* | 11/2008 | Sridhar | H01L 21/823807 257/369 |
| 2008/0311711 A1 | 12/2008 | Hampp | |

* cited by examiner

METHOD FOR MANUFACTURING CMOS TRANSISTOR

CROSS REFERENCE TO RELATED APPLICATIONS

This application is a divisional application of and claims the benefit of U.S. patent application Ser. No. 12/168,062, filed Jul. 3, 2008.

BACKGROUND OF THE INVENTION

1. Field of the Invention

The present invention is related to a CMOS transistor and a method for manufacturing the same, and particularly, to a CMOS transistor capable of preventing Ge out-diffusion and a method for manufacturing the same.

2. Description of the Prior Art

Industrial circles are used to reducing device dimensions to improve the performance of metal-oxide semiconductor (MOS) transistors. However, this method has encountered difficulties with high-expenses and technical bottlenecks in recent years. For these reasons, the industrial circles seek other methods to improve MOS transistor performance. And accordingly, a popular method is to utilize the material characteristics to cause strain effect on MOS transistors.

In order to increase the driving current of a complementary metal-oxide semiconductor (CMOS) transistor including a p-type MOS (PMOS) transistor and an n-type MOS (NMOS) transistor, the industrial circles develop a strained-silicon technique, which uses unique processes or lattice constant discrepancy to increase driving current. The strained-silicon technique substantially includes a substrate-strained based method and a process-induced strain based method. The substrate-strained based system is performed with a strained-silicon substrate or a selective epitaxial growth process that results in lattice constant discrepancy. The process-induced strain based method is performed with several unique processes to form a strained thin film upon a surface of the MOS transistor that exert tensile stress or compressive stress upon the MOS transistor. Both of the strained-silicon techniques introduce strain into the channel region and reduce carrier mobile resistance thereby improving carrier mobility and MOS transistor performance.

Please refer to FIG. 1, which is a schematic diagram illustrating a conventional CMOS transistor 10. The CMOS transistor 10 includes a PMOS transistor 12 and an NMOS transistor 14 disposed on a substrate 16. A plurality of shallow trench isolations (STI) 30 is disposed on the substrate 16 to prevent short-circuiting between the PMOS transistor 12 and the NMOS transistor 14. The NMOS transistor 14 having a source/drain 20A and a gate structure 22A is disposed on a P well 18 formed in the substrate 16. The PMOS transistor 12 having a source/drain 20B and a gate structure 22B is disposed on an N well 24 formed in the substrate 16. The source/drain 20B of the PMOS transistor 12 is a silicon germanium (SiGe) epitaxial layer. A compressive strain resulting from the lattice constant discrepancy of SiGe epitaxial layer is induced into the channel region of the PMOS transistor 12. Nickel silicide layers 26 are respectively formed on the surface of the source/drain 20A, 20B for increasing the Ohmic contact capability between metals and the silicon substrate. In order to enhance carrier mobility of the channel region of the NMOS transistor 14, a high tensile thin film 28 is formed on the CMOS transistor 10. The high tensile thin film 28 is disposed covering the gate structure 22A, 22B and the source/drain 20A, 20B. Thereafter, an UV curing process is performed by a UV radiation to enhance the tensile strain of the high tensile thin film 28 that results in elongating the distance of the lattice of the channel region positioned under the gate structure 22A of the NMOS transistor 14. Therefore, the NMOS transistor 14 has a higher driving current and a better electron mobility in the channel region.

Tensile strain of the high tensile thin film 28 is adjusted by the UV curing process for improving performance of NMOS transistor 14. However, the tensile strain results in Ge-out diffusion at the source/drain 20B of the PMOS transistor 12. As shown in FIG. 2, which is a SEM photo of the CMOS transistor 10, a plurality of black spots are formed on the surface of the nickel silicide layer 26, in which is the evidence of the Ge-out diffusion. Besides, Ge-out diffusion results in silicide agglomeration that increases resistance, reduces the concentration of the Ge in the SiGe epitaxial layer, and affects the accuracy of the threshold voltage of the PMOS transistor 12.

SUMMARY OF THE INVENTION

In order to overcome the issue of Ge-out diffusion, the present invention provides a method of manufacturing a CMOS transistor, which is capable of preventing Ge-out diffusion. Initially, a semiconductor substrate having at least a PMOS transistor and an NMOS transistor is provided. The source/drain of the PMOS transistor has Ge therein. A carbon-doped layer is formed at the top portion of the source/drain of the PMOS transistor. A self-aligned silicide process is performed. At least a tensile thin film is formed covering the semiconductor substrate, the NMOS transistor, and the PMOS transistor. A surface treatment is performed upon the tensile thin film.

In addition, the present invention further discloses a CMOS transistor. The CMOS transistor has a semiconductor substrate, at least a NMOS transistor and at least a PMOS transistor disposed on the semiconductor substrate, and a CESL disposed on the PMOS transistor and the NMOS transistor. The PMOS transistor has a source/drain, which includes Ge therein. A carbon-doped layer is disposed in the top portion of the source/drain of the PMOS transistor, and so that, the CMOS transistor of the present invention is capable of preventing Ge-out diffusion.

The CMOS transistor formed by the method of the present invention has a carbon-doped layer in the top portion of the source/drain of the PMOS transistor. Therefore, the concentration of the Ge dopant is maintained in the source/drain of the PMOS transistor and the issue of Ge-out diffusion is solved.

These and other objectives of the present invention will no doubt become obvious to those of ordinary skill in the art after reading the following detailed description of the preferred embodiment that is illustrated in the various figures and drawings.

DETAILED DESCRIPTION

Figure 8:
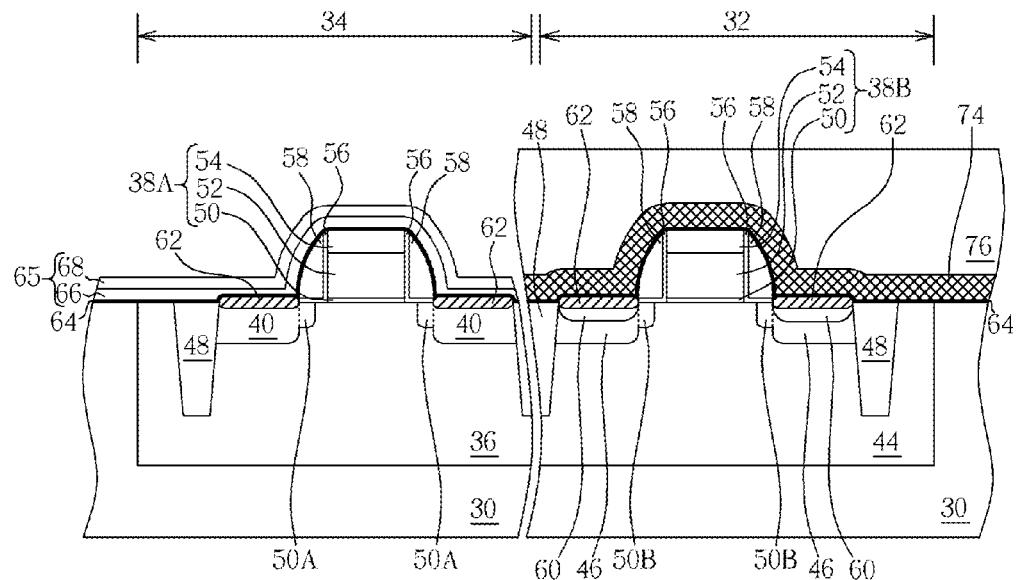
Figure 9:
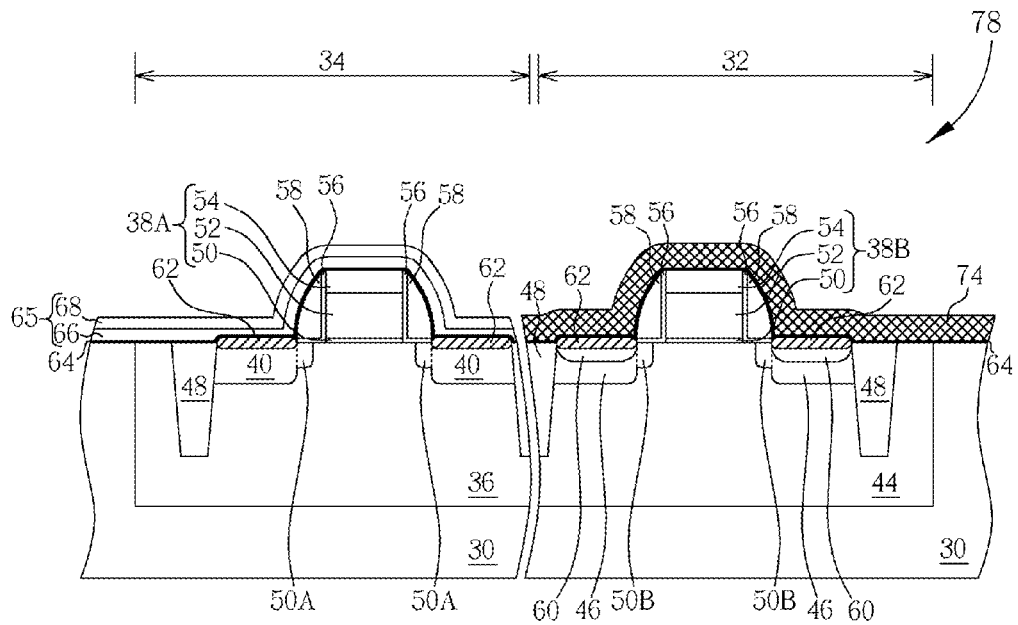
Figure 10:
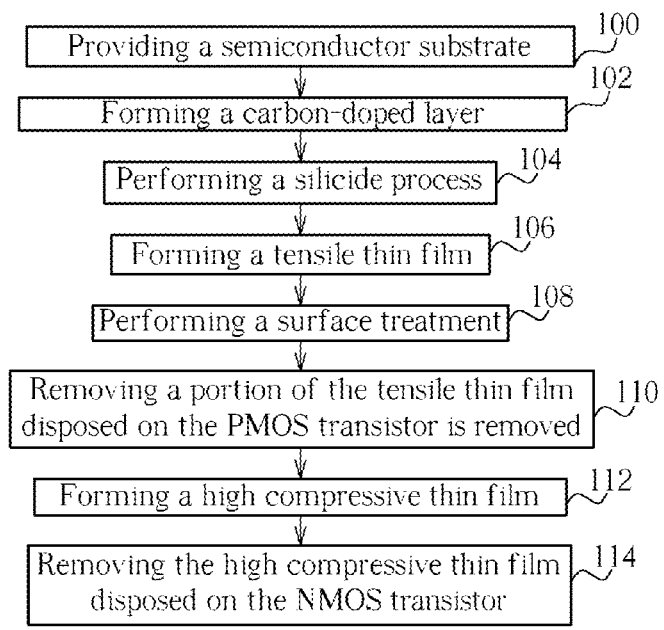
FIG. 10 is a flow diagram of the method of the present invention to manufacture the CMOS transistor for preventing Ge-out diffusion.

Please refer to FIG. 3 through FIG. 10. FIG. 3 to FIG. 9 are schematic diagrams illustrating a method for manufacturing a CMOS transistor according to a preferred embodiment of the present invention. FIG. 10 is a flow diagram of the method of the present invention to manufacture the CMOS transistor for preventing Ge-out diffusion. Please refer to FIG. 3. A semiconductor substrate 30 is provided, in which the semiconductor substrate 30 has at least a PMOS transistor 32 and an NMOS transistor 34 disposed thereon. The NMOS transistor 34 is formed in a P well 36 disposed in the semiconductor substrate 30. The NMOS transistor 34 includes a gate structure 38A formed on the surface of the semiconductor substrate 30 and a source/drain 40 disposed beside the gate structure 38A. The PMOS transistor 32 is formed in an N well 44. The PMOS transistor 32 includes a gate structure 38B formed on the surface of the semiconductor substrate 30 and a source/drain 46 disposed beside the gate structure 38B.

Each of the gate structure 38A, 38B includes a gate dielectric layer 50, a gate 52, and a cap layer 54. The gate dielectric layer may include dielectric materials including silicon oxide, oxynitride, and silicon nitride; high-k dielectric materials including metal oxide, metal silicate, metal aluminate, and metal oxynitride; or combinations thereof. The gate dielectric layer 50 may be formed by a thermal oxidation process, a nitridation process, or a chemical vapor deposition (CVD) process. The gate 52 may use polysilicon, SiGe, metal, silicide, metal nitride, metal oxide, or combinations thereof as material. The material of the cap layer 54 may include silicon oxide, oxynitride, silicon nitride, or silicon carbide (SiC). A thermal oxide layer 56 and a spacer 58 are respectively formed on the sidewall of the gate structure 38A, 38B. The spacers 58 may be a single-layered structure or a multi-layered structure. The preferred material of the first spacers 58 may use silicon oxide, silicon nitride, oxynitride, or other adoptable dielectric material. In addition, a plurality of isolation structures is disposed between the MOS transistors to prevent short-circuiting, such as shallow trench isolations 48 formed between the PMOS transistor 32 and the NMOS transistor 34. The CMOS transistor 30 has lightly doped drain 50A, 50B respectively disposed beside the gate structure 38A, 38B to prevent hot electron effect in the PMOS transistor 32 or the NMOS transistor 34.

In order to enhance the carrier mobility of the channel region of the PMOS transistor disposed under the gate structure 38, the source/drain 46 of the PMOS transistor 32 has Ge therein. The source/drain 46 of the PMOS transistor 32 of the present embodiment is formed by several processes. A patterned photoresist (not shown) is formed on the PMOS transistor 32, and an etch process is performed to form at least a recess (not shown) on the surface of the semiconductor substrate 30 beside the gate structure 38B of the PMOS transistor 32. A selective epitaxial growth process is performed to form a SiGe epitaxial layer in the recess, wherein the SiGe epitaxial layer has a greater lattice constant than that of the semiconductor substrate 30, and is slightly extended approaching to the channel. Preferably, the SiGe epitaxial layer is slightly projected from the top surface of the semiconductor substrate 30 to compress the channel and to keep silicide formed in the following steps from the interface between the source/drain in a distance. The top surface of the SiGe epitaxial layer may be substantially leveled with or lower than the top surface of semiconductor substrate 30. A heavy doped ($P^+$) implantation process is performed to implant P-type dopant, such as boron (B), into the SiGe epitaxial layer. Thus, the formation of the source/drain 46 of the PMOS transistor 34 is accomplished.

Figure 4:
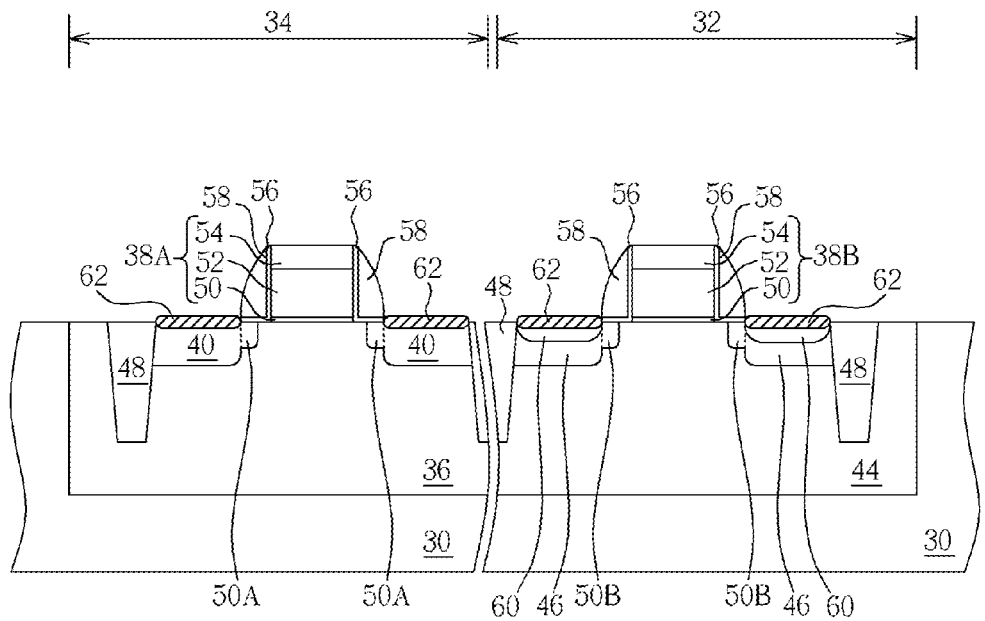

As shown in FIG. 4, a mask (not shown) is formed covering the NMOS transistor 34, and a carbon implantation process is performed to implant carbon into the source/drain 46 of the PMOS transistor 32. A carbon-doped layer 60 is formed in the top portion of the source/drain 46, and the carbon-doped layer 60 has a thickness between 100 angstrom (Å) and 500 Å, preferably between 200 Å and 300 Å. The implantation energy is determined by the depth of the dopant. The preferred implantation energy of the carbon implantation process is approximately between 1 KeV and 5 KeV, and the implantation dosage is approximately between $10^{13}$ atom/cm$^2$ and $10^{16}$ atom/cm$^2$. The preferred implantation energy of the present embodiment is about 2 KeV, and the preferred implantation dosage is about $1.05 \times 10^{15}$ atom/cm$^2$. In addition, the carbon implantation of the present invention may also be performed on the NMOS transistor 32 simultaneously. An annealing process is optionally performed using a furnace or a rapid thermal process (RTP) to activate the doped carbon and to repair the lattice structure of the semiconductor substrate 30 at approximately between 1000° C. and 1050° C. Thereafter, a self-aligned silicide process (salicide process) is performed to form silicide layer 62 on the surface of the source/drain 40, 46. The silicide layer 62 may include nickel and platinum, and has a thickness between 50 Å and 500 Å, preferably between 100 Å and 300 Å. The steps of the salicide process are well known, and will not be described in detail.

Figure 5:
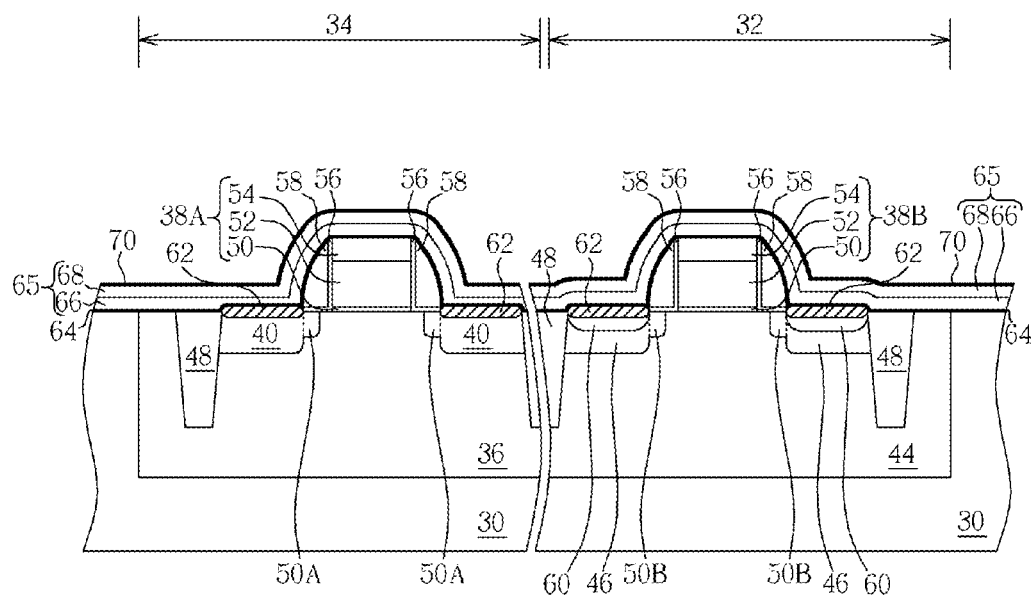

As shown in FIG. 5, a first liner 64 and a tensile thin film 65 are respectively formed covering the PMOS transistor 32, the NMOS transistor 34 and the semiconductor substrate 30. The tensile thin film 65 of the present invention is a multi-layered tensile thin film, and includes a buffered tensile thin film 66 and a high tensile thin film 68. The buffered tensile thin film has a lower tensile stress than that of the high tensile thin film. A surface treatment is optional performed, i.e. an RTP or an UV curing process, to enhance the tensile strain of the tensile thin film 65. Then, a second liner 70 is formed. In addition, the spacers 58 disposed on the sidewall of the PMOS transistor 32 and the NMOS transistor 34 may be removed before the formation of the first liner 64, the tensile thin film 65, and the second liner 70. Accordingly, the tensile thin film 65 may induce tensile stress into the channel region of the NMOS transistor 34 more effectively.

Figure 6:
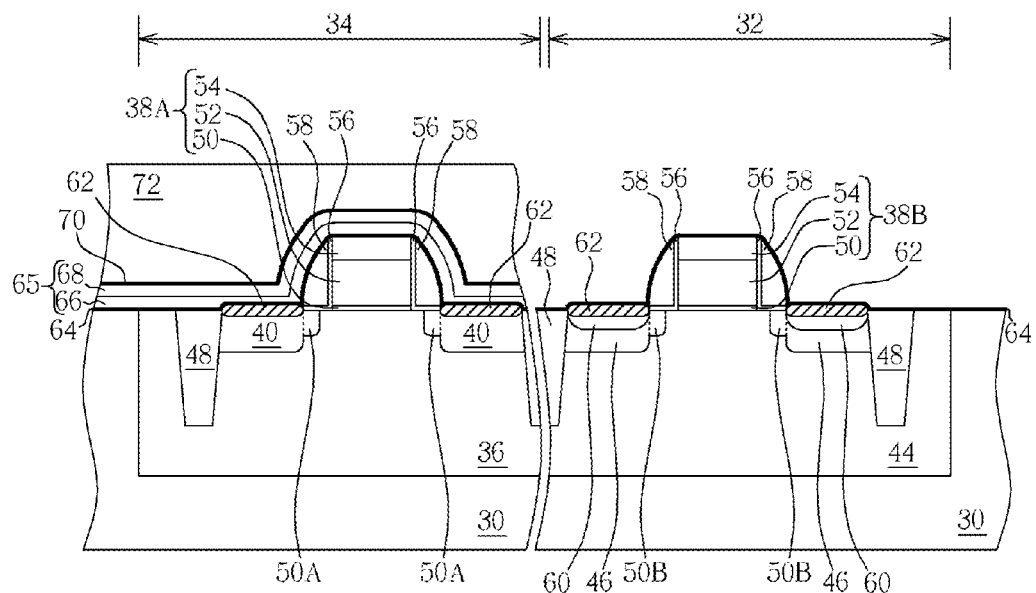
Figure 7:
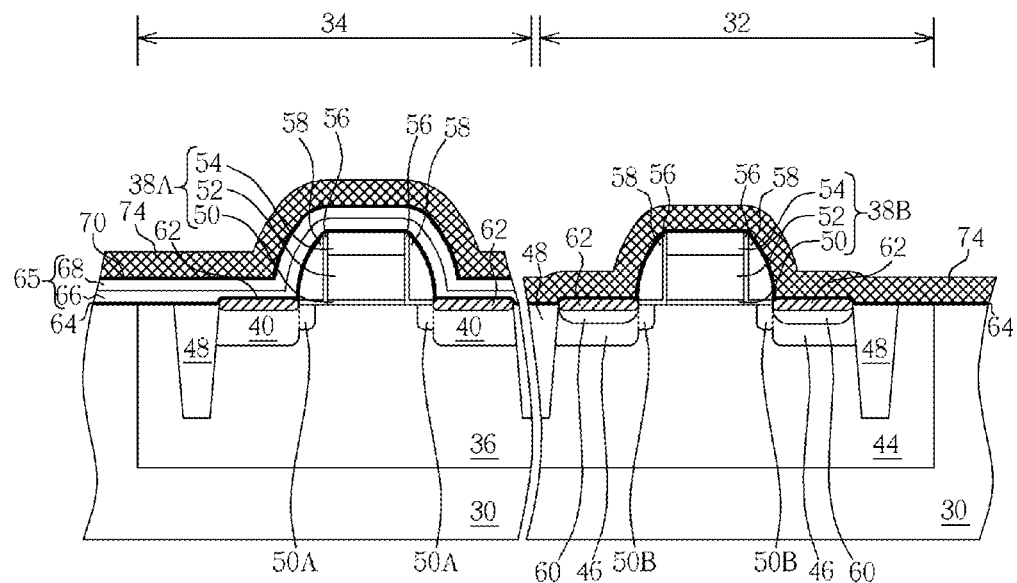

Please refer to FIG. 6, in which a first patterned photoresist 72 is formed on the NMOS transistor 34 after the second liner 70 is formed. The formation of the first patterned photoresist 72 includes steps of coating the photoresist, an exposing process and a developing process to define the pattern. An etch process is performed, such as an isotropic etch process, using the first patterned photoresist 72 as an etch mask to remove the buffered tensile thin film 66, the high tensile thin film 68, and the second liner 70 formed on the PMOS transistor 32. The first liner 64 acts as an etch stop layer and protects the PMOS transistor 32 during the etch process. As shown in FIG. 7, the first pattern photoresist 72 is removed and a high compressive thin film 74 is formed covering the PMOS transistor 32 and the NMOS transistor 34. The high compressive thin film 74 of the present embodiment is formed by another PECVD process, and other methods for depositing the high compressive thin film 74 are allowable.

AS shown in FIG. 8, a second patterned photoresist 76 is formed on the NMOS transistor 32. The formation of the second patterned photoresist 76 includes steps of: coating the photoresist, an exposing process and a developing process to define the pattern. Another etch process is performed using the second patterned photoresist 76 as an etch mask to remove the exposed thin film, for instance, the high compressive thin film 74 and the second liner 70 disposed on the NMOS transistor 34, and so that the high compressive thin film 74 disposed on the gate structure 38B and the surface of the source/drain 46 of the PMOS 74 is protected.

As shown in FIG. 9, the second patterned photoresist 76 disposed on the PMOS transistor 32 is removed, and therefore, the basic structure of a CMOS transistor 78 is formed by the method of the present invention. The tensile thin film 65 disposed on the NMOS 34 and the high compressive thin film 74 disposed on the PMOS transistor 32 may act as a CESL of the CMOS transistor 78. Furthermore, an interlayer dielectric (ILD) layer (not shown) and a patterned photoresist (not shown) are formed, and an anisotropic etching process is performed using the patterned photoresist as an etching mask to form a plurality of contact holes (not shown) in the ILD layer and the CESL (the tensile thin film 65 and the high compressive thin film 74). The contact holes are the connections between the gate structures 38A, 38B or the sources/drains 40, 46 of the PMOS transistor 32 and the NMOS transistor 34 with other electrical devices.

Please refer to FIG. 10, which is a flow diagram illustrating the method of manufacturing the CMOS transistor of the present invention. The steps of the present embodiment are illustrated as follows.

Step 100: A semiconductor substrate is provided. The semiconductor substrate has at least a PMOS transistor and at least an NMOS transistor formed thereon. The source/drain of the PMOS transistor is a SiGe epitaxial layer.

Step 102: A carbon implantation process is performed upon the source/drain of the PMOS transistor. A carbon-doped layer is formed in the top portion of the source/drain of the PMOS transistor.

Step 104: A salicide process is performed to form a silicide layer on the respective source/drain of the PMOS transistor and the NMOS transistor.

Step 106: A tensile thin film is formed. The tensile thin film includes a buffered tensile thin film and a high tensile thin film. The high tensile thin film has a greater stress status than that of the buffered tensile thin film.

Step 108: A surface treatment is performed, such as an RTP or an UV curing process, to strengthen the stress status of the tensile thin film.

Step 110: A portion of the tensile thin film disposed on the PMOS transistor is removed.

Step 112: A high compressive thin film is formed covering the PMOS transistor and the NMOS transistor.

Step 114: A portion of the high compressive thin film disposed on the NMOS transistor is removed.

Additionally, the tensile thin film 65 disposed on the PMOS transistor 78 may be preserved for simplifying steps of fabricating the CMOS transistor 78 of the present invention. The formation of the high compressive thin film 78 on the PMOS transistor 32 is optional.

Figure 1:
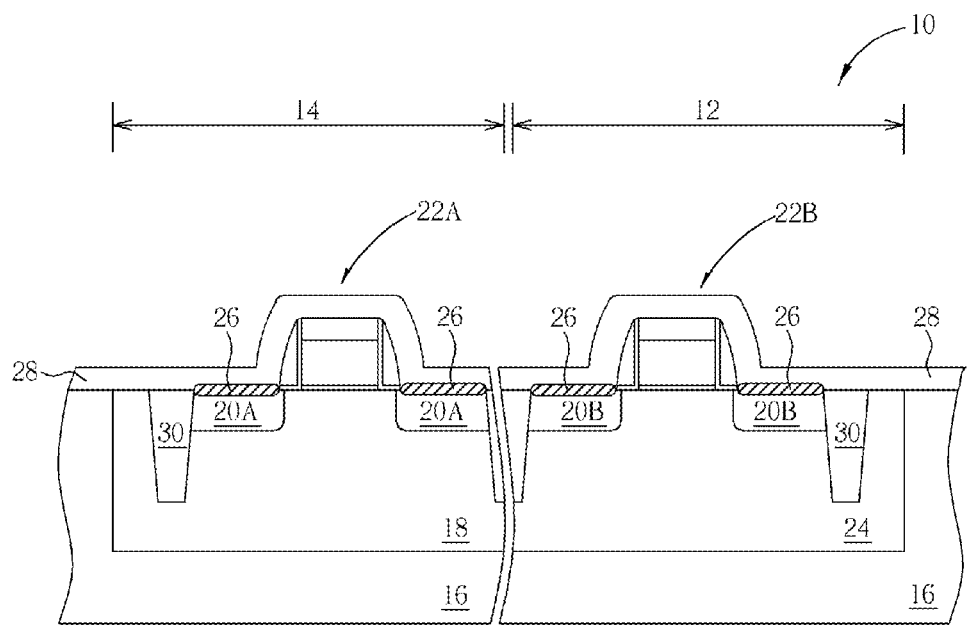
FIG. 1 is a schematic diagram illustrating a conventional CMOS transistor.
Figure 2:
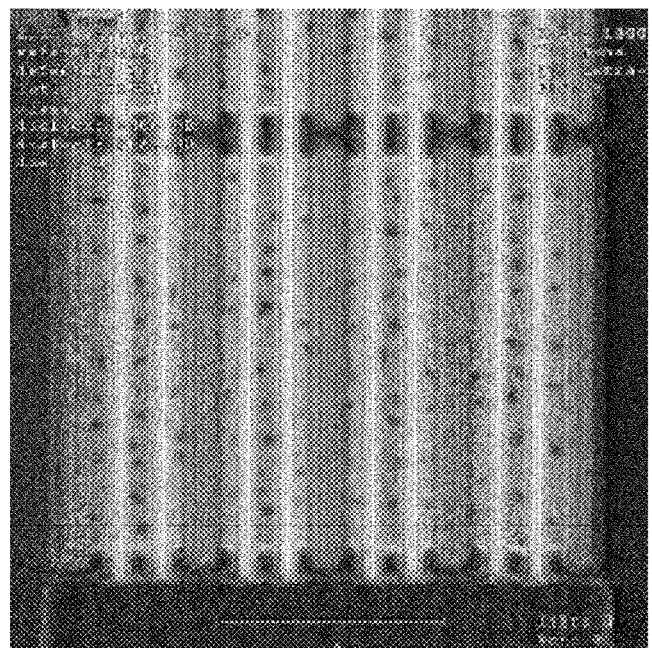
FIG. 2 is a SEM photo of the conventional CMOS transistor.
Figure 3:
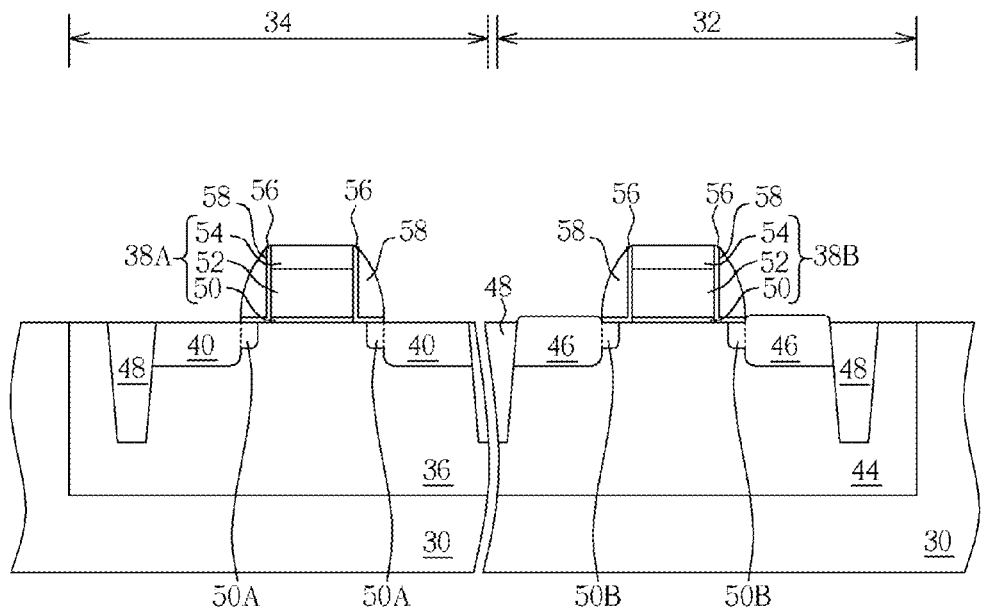
FIG. 3 to FIG. 9 are schematic diagrams illustrating a method for manufacturing a CMOS transistor according to a preferred embodiment of the present invention.
Figure 11:
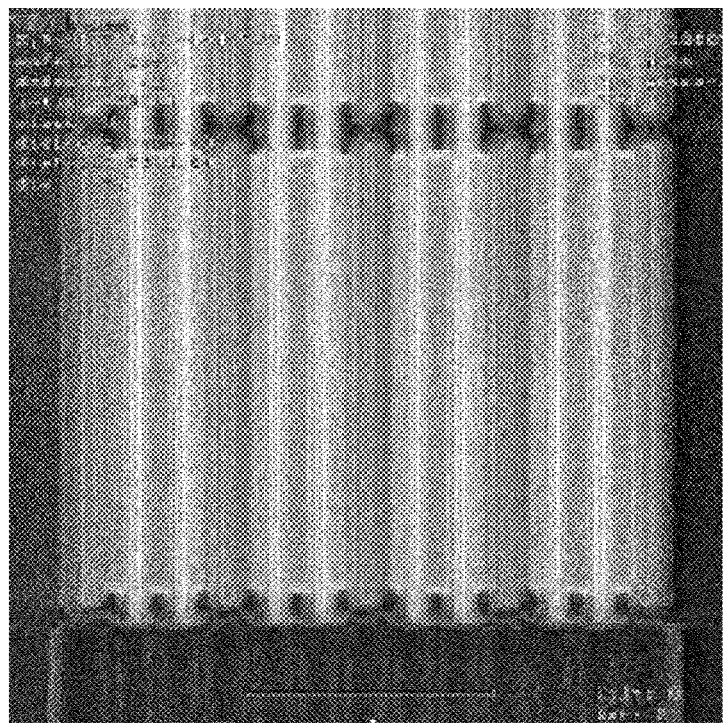
FIG. 11 is a SEM photo of the CMOS transistor manufactured by the method of the present invention.

Please refer to FIG. 11, which is a SEM photo of the CMOS transistor 78 manufactured by the method of the present invention. Referring to FIG. 2 and FIG. 11, Ge-out diffusion occurs at the conventional CMOS transistor 10 and forms a plurality of black spots on the nickel silicide layer 26 shown in FIG. 2. In contrast, no black spot is observed on the silicide 62 of the CMOS transistor 78 formed by the method of the present invention.

As described above, the present invention utilizing a carbon implantation process prior to the formation of the silicide, to implant carbon, which has a smaller radius than the silicon and is neutral, into the source/drain 46 of the PMOS transistor 32, in which the source drain 46 of the PMOS transistor 32 comprises SiGe epitaxial layer. Additionally, the buffered tensile thin film 66 is formed between the high tensile thin film 68 and the silicide layer 62. According to our experiment, the Ge-out diffusion is suppressed in proportion to the thickness of the buffered tensile thin film 66. However, thickness increase of the buffered tensile thin film 66 reduces the ion gain effect of the CMOS transistor 78. Therefore, the present invention using the carbon implantation process to implant carbon as dopant into the lattice of the SiGe epitaxial layer for stabilizing the Ge atom in the SiGe epitaxial layer, reducing the thickness of the buffered tensile thin film 66 and maintaining the ion gain effect of the CMOS transistor 78. And accordingly, the present invention combines the carbon-doped layer 60 formed by the carbon implantation process and the buffered tensile thin film 66 to prevent Ge-out diffusion. However, other amorphous dopants, i.e. Ar, Ge, In, which have a smaller radius than the silicon and are neutral, are useless for preventing Ge-out diffusion.

Furthermore, the formation of the carbon-doped layer in the top portion of the source/drain 46 of the 32 is not limited to be formed prior to the formation of the silicide, which are illustrated in the preferred embodiment. The carbon-doped layer may be formed during the formation of the source/drain 46 of the PMOS transistor 32. For instance, a carbon implantation process is performed prior to the heavy doped implantation process for implanting P-type dopants into the semiconductor substrate 30. In addition, the carbon implantation process may be performed after the heavy doped implantation process. On the other hand, the carbon-doped layer may be formed during the selective epitaxial growth process for forming the SiGe epitaxial layer. For instance, carbon may be added as material of the epitaxial layer during the selective epitaxial growth process. The concentration of the carbon may be increased during the formation of the SiGe epitaxial layer. Therefore, a carbon-doped layer is formed, in which the concentration of the carbon is higher in the later formed SiGe epitaxial layer than in the prior formed SiGe epitaxial layer. After the SiGe epitaxial layer having the carbon-doped layer is formed, a buffered tensile thin film and a high tensile thin film are formed on the CMOS transistor to prevent Ge-out diffusion. In addition, another carbon implantation process may be performed on the SiGe epitaxial layer having the carbon-doped layer thereof to increase the concentration of the carbon in the top portion of the source/drain of the PMOS transistor.

According to afore-mentioned embodiment, the present invention utilizes a carbon implantation process to implant carbon into the top portion of the source/drain of the PMOS transistor, particularly to the portion approaching to the surface of the source/drain of the PMOS transistor. The carbon implantation process is performed before the salicide process. After that, a silicide layer and a CESL having tensile strain or compressive strain are formed on the NMOS transistor and the PMOS transistor. Therefore, the CMOS transistor of the present invention is formed. The carbon-doped layer may act as a barrier layer during several high temperature processes, such as the salicide process, the annealing process, and the RTP process. In addition, the CMOS transistor is silicon cap-free, and therefore, the SiGe epitaxial layer has a facet near the spacer for providing a better compressive strain into the channel region of the PMOS for increasing carrier mobility thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a CMOS transistor, comprising:
   providing a semiconductor substrate having at least an NMOS transistor and at least a PMOS transistor thereon, and a source/drain of the PMOS transistor comprising germanium (Ge), wherein the semiconductor substrate has an N well disposed therein, and the PMOS transistor is formed in the N well, and wherein the source/drain of the PMOS transistor is formed comprising a step of an implantation process to implant P-type dopants into the semiconductor substrate;
   forming a carbon-doped layer in a top portion of the source/drain of the PMOS transistor, wherein the carbon-doped layer is not in contact with the N well and the carbon-doped layer is formed by a carbon implantation process, and wherein the carbon implantation process is performed after the implantation process;
   performing a self-aligned silicide process;
   forming at least a tensile thin film covering the semiconductor substrate, the NMOS transistor, and the PMOS transistor; and
   performing a surface treatment on the tensile thin film.

2. The method of claim 1, wherein the carbon implantation process is performed with an implantation energy between 1 KeV and 5 KeV, and with an implantation dosage between $10^{13}$ atom/cm$^2$ and $10^{16}$ atom/cm$^2$.

3. The method of claim 1, wherein the source/drain of the PMOS transistor is formed comprising steps of:
   performing an etch process to form at least a recess on the surface of the semiconductor substrate in the PMOS transistor; and
   performing a selective epitaxial growth process to form a SiGe epitaxial layer in the recess, wherein the carbon-doped layer is formed during the selective epitaxial growth process.

4. The method of claim 3, wherein the selective growth process comprises carbon as material.

5. The method of claim 4, wherein the concentration of the carbon is increased during the formation of the SiGe epitaxial layer.

6. The method of claim 1, wherein the surface treatment comprises a rapid thermal process (RTP) or an UV curing process.

7. The method of claim 1, wherein the tensile thin film comprises a multi-layered tensile thin film.

8. The method of claim 7, wherein the multi-layered tensile thin film comprises a buffered tensile thin film and a high tensile thin film, and the buffered tensile thin film has a lower tensile stress than that of the high tensile thin film.

9. The method of claim 1, further comprising forming a high compressive thin film covering the PMOS transistor after the tensile thin film is formed.

* * * * *